US010556695B2

(12) United States Patent
Longley, Jr. et al.

(10) Patent No.: US 10,556,695 B2
(45) Date of Patent: Feb. 11, 2020

(54) ROTOR ICE PROTECTION SYSTEM

(71) Applicant: Sikorsky Aircraft Corporation, Stratford, CT (US)

(72) Inventors: Robert F. Longley, Jr., Oxford, CT (US); Matthew Fogarty, Monroe, CT (US)

(73) Assignee: SIKORSKY AIRCRAFT CORPORATION, Stratford, CT (US)

( * ) Notice: Subject to any disclaimer, the term of this patent is extended or adjusted under 35 U.S.C. 154(b) by 192 days.

(21) Appl. No.: 15/528,639

(22) PCT Filed: Dec. 11, 2015

(86) PCT No.: PCT/US2015/065246
§ 371 (c)(1),
(2) Date: May 22, 2017

(87) PCT Pub. No.: WO2016/094797
PCT Pub. Date: Jun. 16, 2016

(65) Prior Publication Data
US 2017/0267361 A1 Sep. 21, 2017

Related U.S. Application Data

(60) Provisional application No. 62/090,642, filed on Dec. 11, 2014.

(51) Int. Cl.
*B64D 15/12* (2006.01)
*G01R 19/00* (2006.01)
(Continued)

(52) U.S. Cl.
CPC .......... *B64D 15/12* (2013.01); *B64D 15/20* (2013.01); *B64D 15/22* (2013.01); *G01R 19/0046* (2013.01)

(58) Field of Classification Search
CPC ........ B64D 15/12; B64D 15/14; B64D 15/22; B64D 15/20; B64C 27/04; B64C 27/72
See application file for complete search history.

(56) References Cited

U.S. PATENT DOCUMENTS

| 2,576,487 A | 11/1951 | Stanley |
| 4,131,250 A | 12/1978 | Binckley et al. |

(Continued)

OTHER PUBLICATIONS

International Search Report and Written Opinion of the International Search Authority dated Feb. 23, 2016 in related PCT Application No. PCT/US2015/065246, 9 pages.

*Primary Examiner* — Dominick L Plakkoottam
(74) *Attorney, Agent, or Firm* — Cantor Colburn LLP

(57) ABSTRACT

A rotor ice protection system (RIPS) apparatus for an aircraft to heat aircraft rotor blades is provided. The RIPS apparatus includes circuitry disposed to transmit electrical loads associated with RIPS operations, an indicator unit disposed to alert a pilot of the aircraft to a RIPS condition indicating an operating status of the RIPS operations, a controller configured to actuate the RIPS operations in accordance with current conditions and to issue a command to the indicator unit to alert the pilot to the RIPS operations according to the actuation and a sensor system disposed to sense whether the circuitry is transmitting the electrical loads and to provide a sensing result to the indicator unit. The indicator unit additionally alerts the pilot to the RIPS operations according to the sensing result.

14 Claims, 3 Drawing Sheets

(51) Int. Cl.
 *B64D 15/22* (2006.01)
 *B64D 15/20* (2006.01)

(56) References Cited

U.S. PATENT DOCUMENTS

| | | | |
|---|---|---|---|
| 5,523,959 | A | 6/1996 | Seegmiller |
| 6,227,492 | B1 * | 5/2001 | Schellhase ............. B64D 15/12 244/134 D |
| 6,832,138 | B1 * | 12/2004 | Straub .................. G05D 1/0077 244/1 R |
| 6,906,537 | B2 | 6/2005 | Goldberg et al. |
| 8,550,402 | B2 | 10/2013 | Houhhan et al. |
| 8,612,067 | B2 * | 12/2013 | Leon ...................... B64D 15/12 701/3 |
| 8,827,207 | B2 | 9/2014 | Mullen et al. |
| 9,919,812 | B2 * | 3/2018 | Shi ......................... B64D 45/00 |
| 2006/0226292 | A1 * | 10/2006 | Houlihan ............... B64D 15/14 244/134 R |
| 2010/0199629 | A1 * | 8/2010 | Chene .................... B64D 15/12 60/39.093 |
| 2011/0277443 | A1 | 11/2011 | Pereira et al. |
| 2013/0013116 | A1 | 1/2013 | Mancuso |
| 2013/0304400 | A1 * | 11/2013 | Isom ..................... B64C 27/006 702/41 |
| 2014/0037446 | A1 * | 2/2014 | Garnett ................. B64D 15/14 416/1 |
| 2014/0076882 | A1 | 3/2014 | Houlihan et al. |
| 2014/0285363 | A1 | 9/2014 | Flemming |

* cited by examiner

ROTOR ICE PROTECTION SYSTEM

CROSS-REFERENCE TO RELATED APPLICATIONS

The present application is a 371 National Stage of International Patent Application No. PCT/US2015/065246, filed on Dec. 11, 2015, which claims priority to U.S. Provisional Application No. 62/090,642, filed on Dec. 11, 2014, the contents of which are incorporated herein by reference in their entirety.

BACKGROUND OF THE INVENTION

The subject matter disclosed herein relates to a rotor ice protection system and, more particularly, to a rotor ice protection system that is designed to a first level of assurance but can be stepped up to a second level of assurance.

In aircraft design, a design assurance level (DAL) or an "Item Development Assurance Level" (IDAL), as defined by DO-178B, is determined from a safety assessment process and hazard analysis by examining the effects of a failure condition in the system. The failure conditions are categorized by their effects on the aircraft, crew and passengers and include catastrophic failures and hazardous failures. DAL A signifies catastrophic failures that may cause a crash and involve errors or loss of critical functions that are required to safely fly and land an aircraft. DAL B signifies hazardous failures that have a large negative impact on safety or performance, or reduce the ability of the crew to operate the aircraft due to physical distress or a higher workload, or cause serious or fatal injuries among the passengers.

For particular components, then, a component that is designed to be DAL A certified is designed with the understanding that a failure of the component will have a catastrophic effect on the aircraft. Thus, a DAL A certified component has to have a certain level of redundancy or failure mitigation capabilities to reduce the likelihood that a catastrophic failure will occur. By contrast, a component that is designed to be DAL B certified is designed with the understanding that a failure of the component will only have hazardous effect. Moreover, conventional modifications of a DAL B certified component in order to make the component DAL A certifiable require complete redesigns or the imposition of significant additional mechanical or electrical components.

BRIEF DESCRIPTION OF THE INVENTION

According to one aspect of the invention, a rotor ice protection system (RIPS) apparatus for an aircraft to heat aircraft rotor blades is provided. The RIPS apparatus includes circuitry disposed to transmit electrical loads associated with RIPS operations, an indicator unit disposed to alert a pilot of the aircraft to a RIPS condition indicating an operating status of the RIPS operations, a controller configured to actuate the RIPS operations in accordance with current conditions and to issue a command to the indicator unit to alert the pilot to the RIPS operations according to the actuation and a sensor system disposed to sense whether the circuitry is transmitting the electrical loads and to provide a sensing result to the indicator unit. The indicator unit additionally alerts the pilot to the RIPS operations according to the sensing result.

According to additional or alternative embodiments, the indicator unit further indicates to the pilot a discrepancy between the RIPS operations sensed according to the sensing result and the RIPS operations according to the actuation.

According to additional or alternative embodiments, the sensor system includes a Hall effect sensor disposed on the circuitry.

According to additional or alternative embodiments, the circuitry and the indicator unit are provided as respectively redundant units, the sensor system being correspondingly provided as redundant units.

According to additional or alternative embodiments, in an event that the current conditions dictate that the aircraft rotor blades are to be heated, the sensor system senses whether the circuitry is transmitting the electrical loads and the indicator unit alerts the pilot that the circuitry is or is not transmitting the electrical loads.

According to additional or alternative embodiments, in an event that the current conditions dictate that the aircraft rotor blades need not be heated, the sensor system senses whether the circuitry is transmitting the electrical loads and the indicator unit alerts the pilot that the circuitry is not or is transmitting the electrical loads.

According to another aspect of the invention, an aircraft is provided and includes an airframe, rotor blades supportable on the airframe and drivable to rotate about a rotational axis and a rotor ice protection system (RIPS) apparatus comprising a RIPS assembly configured to heat the rotor blades and components configured to monitor electrical loads during RIPS operations and to report a RIPS status to a pilot of the aircraft.

According to additional or alternative embodiments, the RIPS assembly includes circuitry disposed to transmit electrical loads associated with RIPS operations, an indicator unit disposed to alert the pilot to a RIPS condition and a controller configured to actuate the RIPS operations in accordance with current conditions and to issue a command to the indicator unit to alert the pilot according to the actuation. The components include a sensor system disposed to sense whether the circuitry is transmitting the electrical loads and to provide a sensing result to the indicator unit, wherein the indicator unit additionally alerts the pilot to the RIPS operations according to the sensing result.

According to additional or alternative embodiments, the rotor blades include main and tail rotor blades.

According to additional or alternative embodiments, the RIPS assembly further includes a junction box into which the electrical loads are input and from which the electrical loads are output toward the main and tail rotor blades, a main rotor slip ring operably disposed between the junction box and the main rotor blades and a tail rotor slip ring operably disposed between the junction box and the tail rotor blades.

According to additional or alternative embodiments, the indicator unit further indicates to the pilot a discrepancy between the RIPS operations sensed according to the sensing result and the RIPS operations according to the actuation.

According to additional or alternative embodiments, the sensor system includes a Hall effect sensor disposed on the circuitry.

According to additional or alternative embodiments, the circuitry and the indicator unit are provided as respectively redundant units, the sensor system being correspondingly provided as redundant units.

According to additional or alternative embodiments. in an event that the current conditions dictate that the rotor blades are to be heated, the sensor system senses whether the circuitry is transmitting the electrical loads and the indicator unit alerts the pilot that the circuitry is or is not transmitting the electrical loads.

According to additional or alternative embodiments, in an event that the current conditions dictate that the rotor blades are not to be heated, the sensor system senses whether the circuitry is transmitting the electrical loads and the indicator unit alerts the pilot that the circuitry is not or is transmitting the electrical loads.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

FIG. 3 is a flow diagram illustrating a method of operating the components of

FIG. 2 in accordance with embodiments.

The detailed description explains embodiments of the invention, together with advantages and features, by way of example with reference to the drawings.

DETAILED DESCRIPTION OF THE INVENTION

As will be described below, a rotor ice protection system (RIPS) that is certified at design assurance level (DAL) B is stepped up to DAL A without the imposition of significant additional mechanical or electrical components. The step up is achieved using additional current sensing circuitry to create an independent and redundant detection system to determine when main rotor and tail rotor blades are being heated. The circuitry will monitor or sense electrical current (loads) within the RIPS power distribution components and results of that monitoring and sensing will be fed into cockpit displays independently of a present RIPS. The displays, which are DAL A certifiable, will process the monitoring/sensing results and compare them to RIPS controller information. A discrepancy between the two independent sources will create a caution identifying the RIPS as degraded.

Figure 1:
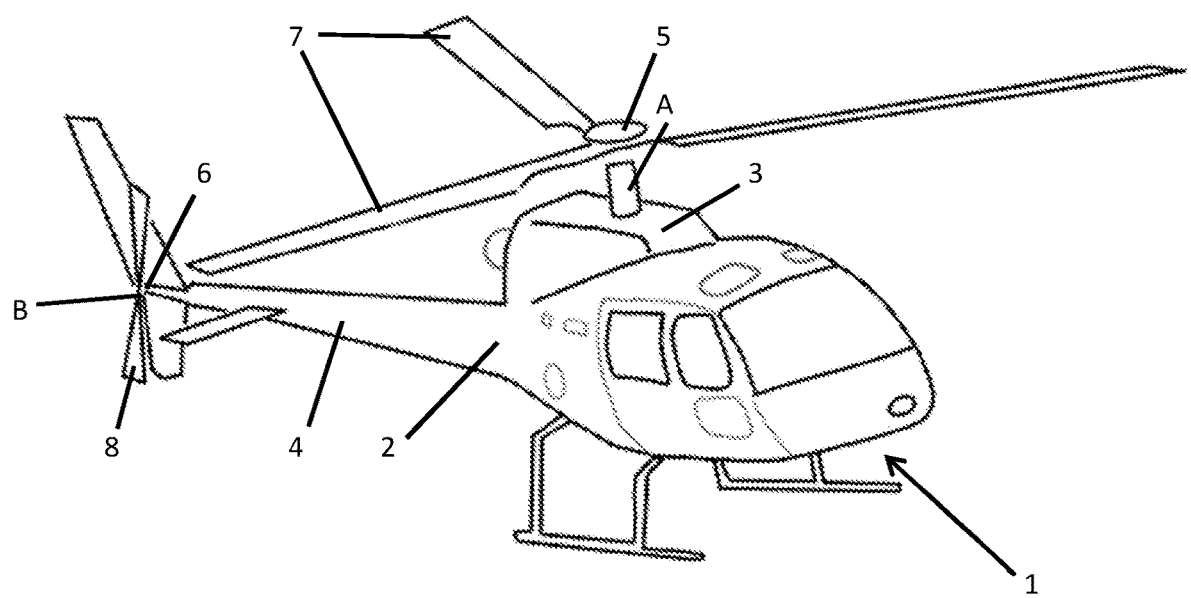
FIG. 1 is a perspective view of an aircraft in accordance with embodiments.

With reference to FIG. 1, an aircraft 1 is provided and may be configured as a single rotor helicopter, a compound helicopter or any other type of helicopter or rotorcraft. The aircraft 1 includes an airframe 2, which is formed to define a cabin in which a pilot and, in some cases, one or more crewmen can be accommodated. The airframe 2 has an upper portion 3 and a tail portion 4 at which a main rotor apparatus 5 and a tail rotor apparatus 6 are supported. The main rotor apparatus 5 includes multiple main rotor blades 7 that are drivable to rotate about rotational axis A to generate lift and thrust for the aircraft 1. The tail rotor apparatus 6 includes multiple tail rotor blades 8 that are drivable to rotate about rotational axis B to generate an anti-torque moment for the aircraft 1.

Although not shown in FIG. 1, the aircraft 1 further includes an engine, a transmission unit and a flight computer. The flight computer controls various operations of the engine and the transmission in accordance with current light conditions and pilot inputted commands. The engine is configured to generate power which is transmitted to the main and tail rotor apparatuses 5 and 6 via the transmission unit in accordance with commands issued by the flight computer in order to drive the rotations of the main and tail rotor blades 7 and 8. While shown in the context of a conventional helicopter, it is understood that aspects can be used in other types of aircraft, such as coaxial aircraft, and propeller-drive fixed wing aircraft, and that such designs do not need to have heating for both main and tail rotor blades 7 and 8 as in the shown embodiment.

Figure 2:
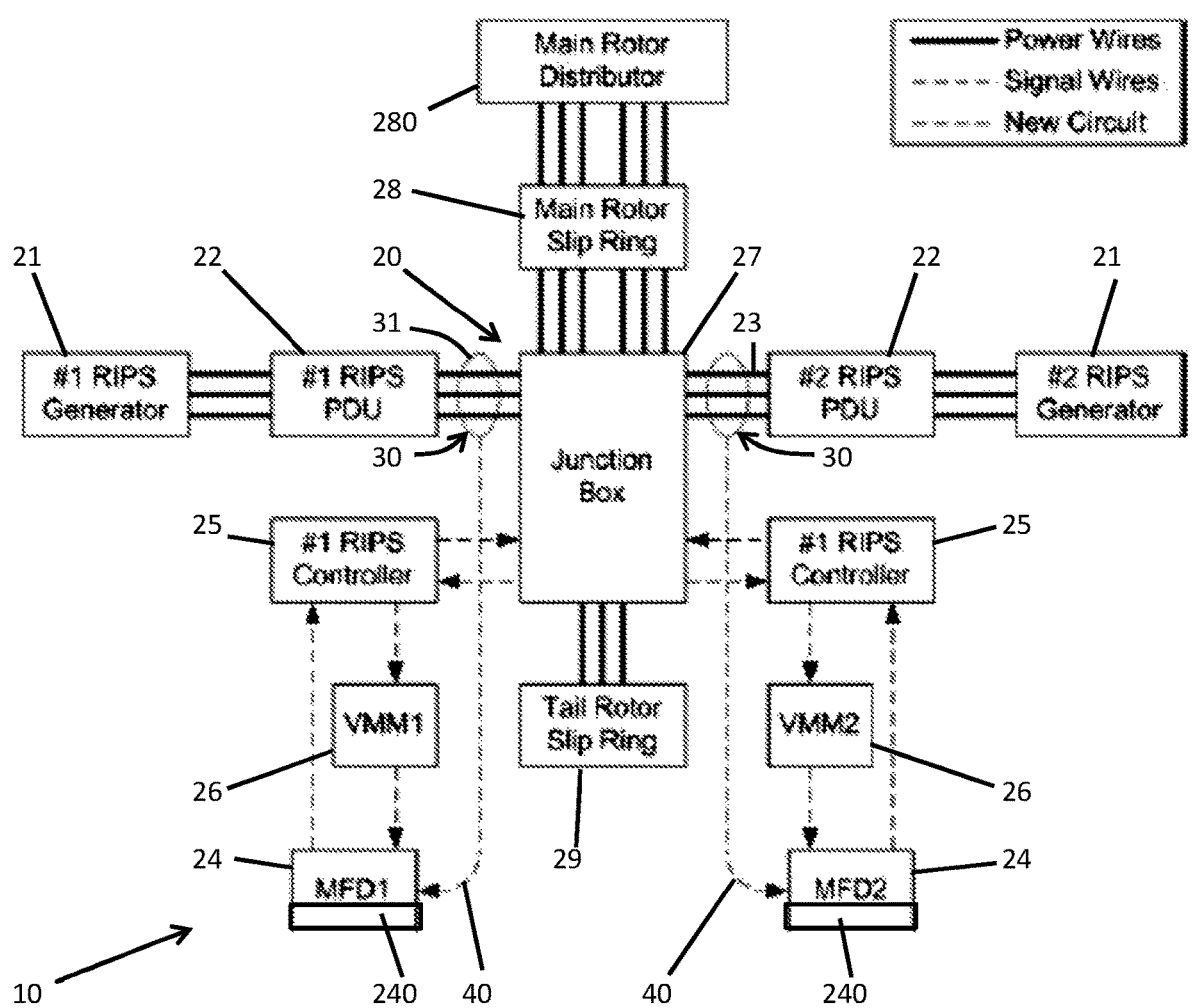
FIG. 2 is a schematic illustration of components of the aircraft of FIG. 1.

With reference to FIG. 2, a rotor ice protection system (RIPS) apparatus 10 of the aircraft 1 is provided and includes a DAL B RIPS assembly 20 that is configured to heat the main and tail rotor blades 7 and 8 in accordance with RIPS operations and additional components. The additional components are configured to step up the RIPS assembly 20 to being DAL A certifiable by monitoring electrical loads during RIPS operations and reporting a RIPS status to a pilot of the aircraft 1. As shown in the embodiment in FIG. 2, the RIPS assembly 20 includes first and second RIPS generators 21, first and second RIPS power distribution units (PDUs) 22, circuitry 23, first and second indicator or display units 24, first and second RIPS controllers 25 and first and second vehicle management modules (VMMs) 26.

The first and second RIPS generators 21 are configured to generate the electrical loads needed to execute RIPS operations (i.e., main and tail rotor heating in icing conditions). The first and second RIPS PDUs 22 are configured to determine where and how the electrical loads are distributed. The first and second VMMs 26 are each respectively interposed between corresponding ones of the first and second RIPS controllers 25 and the first and second display units 24. While not required in all aspects, the display unit 24 can be a multi-function display.

The RIPS assembly 20 further includes a junction box 27 into which the electrical loads generated by the first and second RIPS generators 21 are input and from which the electrical loads are output toward the main and tail rotor blades 7 and 8. A main rotor slip ring 28 is operably disposed between the junction box 27 and a main rotor distributor 280 and transmits the electrical load between the main rotor distributor 280, which is rotating relative to the junction box 27, and the junction box 27. The main rotor distributor 280 provides the electrical load to the main rotor blades 7 (shown in FIG. 1). The tail rotor slip ring 29 is operably disposed between the junction box 27 and the tail rotor blades 8 (shown in FIG. 1), which rotate relative to the junction box 27. While not shown, the main and tail rotor blades 7 and 8 include wires (such as in a heater mat) that, when receiving the electrical load via the respective main rotor and tail rotor slip rings 28 and 29, will generate heat, thereby preventing ice from building on the main and tail rotor blades 7 and 8.

The circuitry 23 includes 3-phase circuitry and is coupled to several of the features noted above. The circuitry 23 is thus disposed to transmit at least the electrical loads associated with RIPS operations from the first and second RIPS PDUs 22 to the junction box 27, from the junction box 27 to the main rotor distributor 280 via the main rotor slip ring 28 and from the junction box 27 to the tail rotor slip ring 29.

The first and second display units 24 are disposed to alert the pilot to a RIPS condition. The first and second RIPS controllers 25 are coupled to the junction box 27 by signal wires and are configured to issue signals to the first and second RIPS generators 21 and the first and second RIPS PDUs 22 via the junction box 27 to thereby control the RIPS operations in accordance with current conditions. The first and second RIPS controllers 25 are further configured to issue commands to the first and second display units 24 via the first and second VMMs 26 to alert the pilot as to the actuation of the RIPS operations.

As such, when the main and tail rotor blades 7 and 8 need to be deiced, the pilots use the display units 24 to issue a command to the first and second RIPS controllers 25 to control the first and second RIPS generators 21 to supply the electrical load to the heater mats in the main and tail rotor blades 7 and 8. Once activated, the first and second RIPS controllers 25 issue the commands to first and second display units 24 via the first and second VMMs 26 to alert the pilot that the electrical load is being supplied. Conversely, when the main and tail rotor blades 7 and 8 no longer need to be deiced, the pilots use the display units 24 to issue a command to the first and second RIPS controllers 25 to control the first and second RIPS generators 21 to stop supplying the electrical load to the heater mats in the main and tail rotor blades 7 and 8. Once deactivated, the first and second RIPS controllers 25 issue the commands to the first and second display units 24 via the first and second VMMs 26 to alert the pilot that the electrical load is no longer being supplied.

The additional components include a sensor system 30 and additional circuitry 40. The sensor system 30 is a Hall effect sensor 31 and is disposed on the circuitry 23 between the first and second RIPS PDUs 22 and the junction box 27 to sense whether the circuitry 23 is transmitting the electrical loads from the first and second RIPS PDUs 22 to the junction box 27. The additional circuitry 40 is coupled at a first end thereof to the sensor system 30 and at a second end thereof to the first and second display units 24. Thus, the additional circuitry 40 serves as a coupling between the sensor system 30 and the first and second display units 24 and, in this position, the additional circuitry 40 is configured to cause the first and second display units 24 to inform the pilot of a result of the sensing of the circuitry 23 by the sensor system 30. While described in terms of the Hall effect sensor 31, it is understood that other types of sensors could be used to sense the presence of an electrical load between the RIPS PDU 22 and the junction box 27.

In accordance with embodiments, the circuitry 23 and the first and second display units 24 are both provided as respectively redundant units along with the other doubled-up features described above. The sensor system 30 and the additional circuitry 40 are also correspondingly provided as respectively redundant units.

As described above, the first and second display units 24 include cockpit displays 240 that are DAL A certified. As such, it is to be understood that the first and second display units 24 are designed with the understanding that failures thereof could have catastrophic effects and thus they have a certain level of redundancy or failure mitigation capabilities to reduce the likelihood that a catastrophic failure will occur. These cockpit displays 240 are employed by the sensor system 30 and the additional circuitry 40 to inform the pilot of the result of the sensing of the circuitry 23 by the sensor system 30 as well as the RIPS controller 25 and VMMs 26 so that the pilot can ascertain whether or not the RIPS assembly 20 is operating correctly or incorrectly.

That is, in an event that the current conditions suggest that icing could be a problem and that the main and tail rotor blades 7 and 8 need to be heated to be protected from the icing, the current conditions dictate that the RIPS assembly 20 be activated. In such a case, the sensor system 30 senses whether the circuitry 23 is transmitting the required electrical loads between the first and second RIPS PDUs 22 and the junction box 27. Then, in an event that the sensor system 30 senses that the circuitry 23 is transmitting the electrical loads, the additional circuitry 40 causes the first and second display units 24 to inform the pilot that the circuitry 23 is transmitting the required electrical loads and that the RIPS assembly 20 is operating correctly. On the other hand, in an event that the sensor system 30 senses that the circuitry 23 is not transmitting the electrical loads, the additional circuitry 40 causes the first and second display units 24 to inform the pilot that the circuitry 23 is not transmitting the required electrical loads and that the RIPS assembly 20 is operating incorrectly. In this latter case, the pilot may be informed as to the non-transmission/incorrect RIPS assembly operation by a warning light or error message provided by way of the cockpit displays 240.

By contrast, in an event that the current conditions suggest that icing is not a problem and that the main and tail rotor blades 7 and 8 do not need to be heated to be protected from the icing, the current conditions dictate that the RIPS assembly 20 be deactivated. In such a case, the sensor system 30 senses whether the circuitry 23 is transmitting electrical loads between the first and second RIPS PDUs 22 and the junction box 27. Then, in an event that the sensor system 30 senses that the circuitry 23 is transmitting electrical loads, the additional circuitry 40 causes the first and second display units 24 to inform the pilot that the circuitry 23 is transmitting electrical loads and that the RIPS assembly 20 is operating incorrectly. On the other hand, in an event that the sensor system 30 senses that the circuitry 23 is not transmitting the electrical loads, the additional circuitry 40 causes the first and second display units 24 to inform the pilot that the circuitry 23 is not transmitting the required electrical loads and that the RIPS assembly 20 is operating correctly. In the former case, the pilot may be informed as to the transmission/incorrect RIPS assembly operation by a warning light or error message provided by way of the cockpit displays 240.

Figure 3:
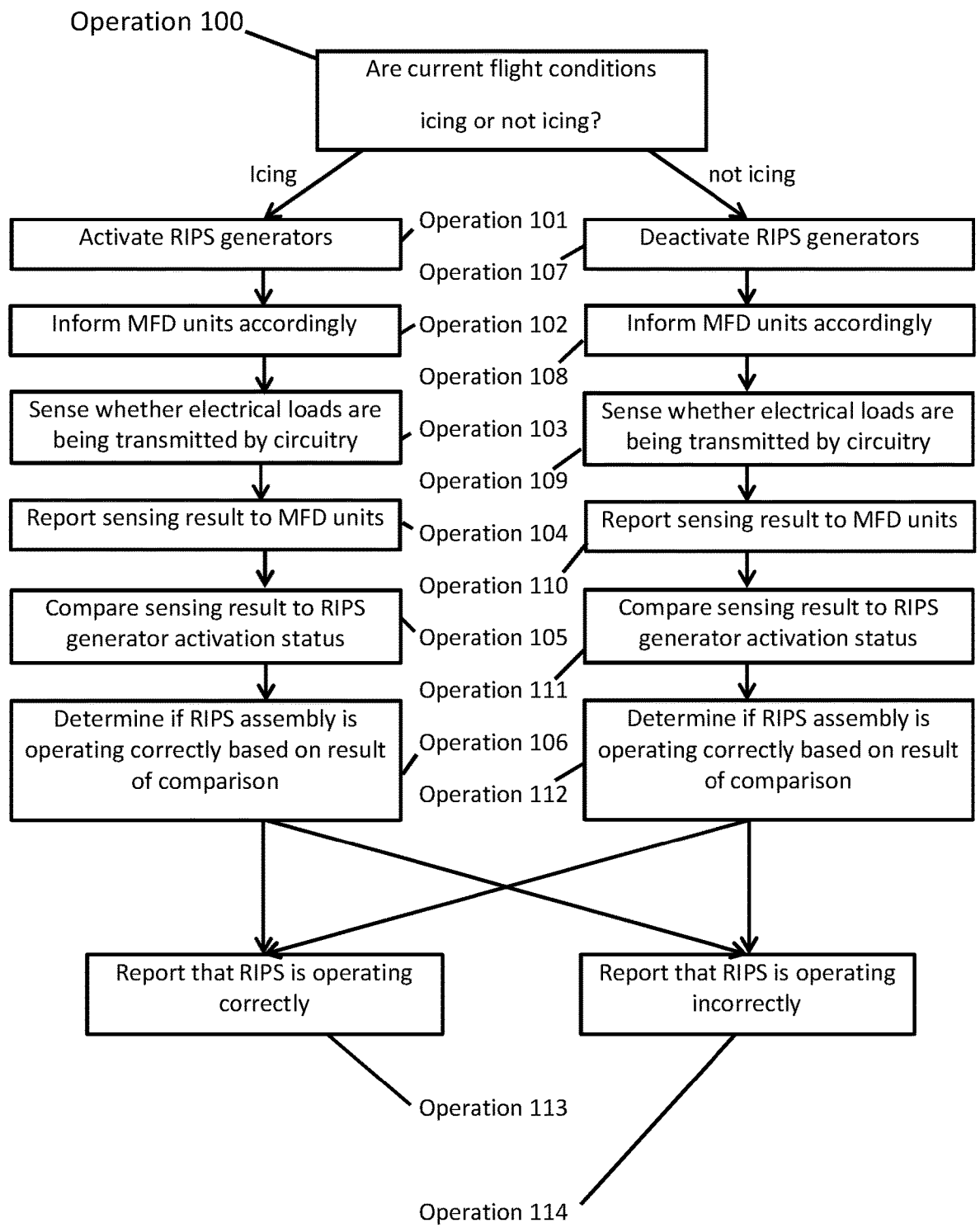

This control scheme is illustrated in FIG. 3. As shown in FIG. 3, the first and second RIPS controllers 25 initially determine whether the current flight conditions are icing or non-icing conditions (operation 100). In an event that the current flight conditions are icing conditions, the first and second RIPS controllers 25 activate the first and second RIPS generators 21 (operation 101) and inform the first and second display units 24 accordingly (operation 102). The sensor system 30 then senses whether the circuitry 23 is transmitting the required electrical loads from the first and second RIPS PDUs 22 to the junction box 27 (operation 103) and the additional circuitry 40 reports results of the sensing to the first and second display units 24 (operation 104). The first and second display units 24 or, more particularly, the DAL A certified cockpit displays 240, then compare the sensing results to the information received about RIPS activation from the first and second RIPS controllers 25 (operation 105) and thus determine if the RIPS assembly 20 is operating correctly or not (operation 106) from a result of the comparison.

That is, it is determined that the RIPS assembly 20 is operating correctly in an event that the circuitry 23 is transmitting the required electrical loads from the first and second RIPS PDUs 22 to the junction box 27. On the other hand, it is determined that the RIPS assembly 20 is operating incorrectly in an event that the circuitry 23 is not transmitting the required electrical loads from the first and second RIPS PDUs 22 to the junction box 27.

Returning to operation 100, in an event that the current flight conditions are not icing conditions, the first and second RIPS controllers 25 deactivate the first and second RIPS generators 21 (operation 107) and inform the first and second display units 24 accordingly (operation 108). The sensor system 30 then senses whether the circuitry 23 is transmitting electrical loads from the first and second RIPS PDUs 22 to the junction box 27 (operation 109) and the additional circuitry 40 reports results of the sensing to the first and second display units 24 (operation 110). The first and second display units 24 or, more particularly, the DAL A certified cockpit displays 240, then compare the sensing results to the information received about RIPS activation from the first and second RIPS controllers 25 (operation 111) and thus determine if the RIPS assembly 20 is operating correctly or not (operation 112) from a result of the comparison.

That is, it is determined that the RIPS assembly 20 is operating correctly in an event that the circuitry 23 is not transmitting electrical loads from the first and second RIPS PDUs 22 to the junction box 27. On the other hand, it is determined that the RIPS assembly 20 is operating incorrectly in an event that the circuitry 23 is transmitting electrical loads from the first and second RIPS PDUs 22 to the junction box 27.

In any case, the first and second display units 24 report to the pilot that the RIPS assembly 20 is operating correctly in operation 113, or incorrectly in operation 114. Specifically, if the current flight conditions dictate that the RIPS assembly 20 should be activated and the sensor system 30 senses that the electrical loads are being transmitted by the circuitry 23 or where the RIPS assembly 20 should not be activated and the sensor system 30 senses that the electrical loads are not being transmitted by the circuitry 23 (operation 113). Conversely, the first and second display units 24 report to the pilot that the RIPS assembly 20 is operating incorrectly if the current flight conditions dictate that the RIPS assembly 20 should be activated and the sensor system 30 senses that the electrical loads are not being transmitted by the circuitry 23 or the RIPS assembly 20 should not be activated and the sensor system 30 senses that the electrical loads are being transmitted by the circuitry 23 (operation 114). As such, aspects of the invention further allow for a mechanism which both independently verifies the correct operation of the RIPS system 20 while also providing a mechanism to alert the pilot that the RIPS system 20 is likely malfunctioning.

While described shown in the context of dual system display units 24, VMMs 26, RIPS controllers 25, RIPS PDUs 22 and RIPS controllers 21, it is understood that a single system could be used, or that more than two systems could be used in other contexts.

Further, while shown in relation to displays 24 and 240, it is understood that displays 24 and 240 are one example of indicator units, and that other mechanisms can be used to indicate RIPS operations, including audio units, tactile units, and combinations thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A rotor ice protection system (RIPS) apparatus for an aircraft to heat aircraft rotor blades, the RIPS apparatus comprising:
   a RIPS generator configured to generate electrical loads for RIPS operations;
   a power distribution unit (PDU) electrically connected to the RIPS generator;
   a junction box electrically connected to the PDU;
   circuitry disposed between the RIPS generator and the junction box to transmit the electrical loads associated with RIPS operations;
   an indicator unit disposed to alert a pilot of the aircraft to a RIPS condition indicating an operating status of the RIPS operations;
   a controller configured to actuate the RIPS operations in accordance with current conditions and to issue a command to the indicator unit to alert the pilot to the RIPS operations according to the actuation; and
   a sensor system disposed on the circuitry to sense whether the circuitry is transmitting the electrical loads to the RIPS apparatus in the absence of a heating demand and to provide a sensing result associated with the electrical loads passing to the RIPS apparatus in the absence of a heating demand to the indicator unit, wherein the indicator unit additionally alerts the pilot to the RIPS operations according to the sensing result.

2. The RIPS apparatus according to claim 1, wherein the indicator unit further indicates to the pilot a discrepancy between the RIPS operations sensed according to the sensing result and the RIPS operations according to the actuation.

3. The RIPS apparatus according to claim 1, wherein the sensor system comprises a Hall effect sensor disposed on the circuitry.

4. The RIPS apparatus according to claim 1, wherein the circuitry and the indicator unit are provided as respectively redundant units, the sensor system being correspondingly provided as redundant units.

5. The RIPS apparatus according to claim 1, wherein, in an event that the current conditions dictate that the aircraft rotor blades are to be heated, the sensor system senses whether the circuitry is transmitting the electrical loads and the indicator unit alerts the pilot that the circuitry is or is not transmitting the electrical loads.

6. The RIPS apparatus according to claim 1, wherein the sensing system is disposed on the circuitry between the PDU and the junction box.

7. An aircraft, comprising:
   an airframe;
   rotor blades supportable on the airframe and drivable to rotate about at least one rotational axis; and
   a rotor ice protection system (RIPS) apparatus comprising a RIPS assembly configured to heat the rotor blades the RIPS system comprising:
   a RIPS generator configured to generate electrical loads for RIPS operations;
   a power distribution unit (PDU) electrically connected to the RIPS generator;
   a junction box electrically connected to the PDU;
   circuitry disposed between the RIPS generator and the junction box to transmit the electrical loads associated with RIPS operations;

an indicator unit disposed to alert a pilot of the aircraft to a RIPS condition indicating an operating status of the RIPS operations;

a controller configured to actuate the RIPS operations in accordance with current conditions and to issue a command to the indicator unit to alert the pilot to the RIPS operations according to the actuation; and a sensor system disposed on the circuitry to sense whether the circuitry is transmitting the electrical loads to the RIPS apparatus in the absence of a heating demand and to provide a sensing result associated with the electrical loads passing to the RIPS apparatus in the absence of a heating demand to the indicator unit, wherein the indicator unit additionally alerts the pilot to the RIPS operations according to the sensing result.

8. The aircraft according to claim 7, wherein the rotor blades comprise main rotor blades and tail rotor blades.

9. The aircraft according to claim 8, wherein the RIPS assembly further comprises:

a main rotor slip ring operably disposed between the junction box and the main rotor blades; and a tail rotor slip ring operably disposed between the junction box and the tail rotor blades.

10. The aircraft according to claim 7, wherein the indicator unit further indicates to the pilot a discrepancy between the RIPS operations sensed according to the sensing result and the RIPS operations according to the actuation.

11. The aircraft according to claim 7, wherein the sensor system comprises a Hall effect sensor disposed on the circuitry.

12. The aircraft according to claim 7, wherein the circuitry and the indicator unit are provided as respectively redundant units, the sensor system being correspondingly provided as redundant units.

13. The aircraft according to claim 7, wherein, in an event that the current conditions dictate that the rotor blades are to be heated, the sensor system senses whether the circuitry is transmitting the electrical loads and the indicator unit alerts the pilot that the circuitry is or is not transmitting the electrical loads.

14. The aircraft according to claim 7, wherein the sensing system is disposed on the circuitry between the PDU and the junction box.

* * * * *